US011898236B2

(12) United States Patent
Wang et al.

(10) Patent No.: US 11,898,236 B2
(45) Date of Patent: Feb. 13, 2024

(54) METHODS AND APPARATUS FOR PROCESSING A SUBSTRATE

(71) Applicant: Applied Materials, Inc., Santa Clara, CA (US)

(72) Inventors: Zhiyong Wang, San Jose, CA (US); Halbert Chong, San Jose, CA (US); John C. Forster, Mountain View, CA (US); Irena H. Wysok, San Jose, CA (US); Tiefeng Shi, San Jose, CA (US); Gang Fu, Cupertino, CA (US); Renu Whig, Chandler, AZ (US); Keith A Miller, Mountain View, CA (US); Sundarapandian Ramalinga Vijayalakshmi Reddy, Bangalore (IN); Jianxin Lei, Fremont, CA (US); Rongjun Wang, Dublin, CA (US); Tza-Jing Gung, San Jose, CA (US); Kirankumar Neelasandra Savandaiah, Bangalore (IN); Avinash Nayak, Bangalore (IN); Lei Zhou, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 27 days.

(21) Appl. No.: 17/506,075

(22) Filed: Oct. 20, 2021

(65) Prior Publication Data

US 2023/0122956 A1    Apr. 20, 2023

(51) Int. Cl.
  *C23C 14/34*   (2006.01)
  *H01J 37/32*   (2006.01)
  *C23C 14/50*   (2006.01)

(52) U.S. Cl.
  CPC ........ *C23C 14/345* (2013.01); *C23C 14/3485* (2013.01); *H01J 37/32027* (2013.01);
  (Continued)

(58) Field of Classification Search
  CPC ... C23C 14/345; C23C 14/3485; C23C 14/50; H01J 37/32027; H01J 37/32091; H01J 37/32174
  See application file for complete search history.

(56) References Cited

U.S. PATENT DOCUMENTS 5,403,459 A *  4/1995  Guo .................. C23C 14/34
                                          204/298.31
5,518,593 A *  5/1996  Hosokawa .......... C23C 14/3407
                                          118/724

(Continued)

FOREIGN PATENT DOCUMENTS

KR    10-2021-0034721 A    3/2021

OTHER PUBLICATIONS

U.S. Appl. No. 17/506,075, filed Oct. 20, 2021.
International Search Report for PCT/US2022/035931, dated Oct. 31, 2022.

*Primary Examiner* — Nicholas A Smith
*Assistant Examiner* — Patrick S Ott
(74) *Attorney, Agent, or Firm* — MOSER TABOADA

(57) ABSTRACT

Methods and apparatus for processing a substrate are provided herein. For example, a processing chamber for processing a substrate comprises a sputtering target, a chamber wall at least partially defining an inner volume within the processing chamber and connected to ground, a power source comprising an RF power source, a process kit surrounding the sputtering target and a substrate support, an auto capacitor tuner (ACT) connected to ground and the sputtering target, and a controller configured to energize the cleaning gas disposed in the inner volume of the processing chamber to create the plasma and tune the sputtering target using the ACT to maintain a predetermined potential difference between the plasma in the inner volume and the process kit during the etch process to remove sputtering material (Continued)

from the process kit, wherein the predetermined potential difference is based on a resonant point of the ACT.

17 Claims, 2 Drawing Sheets

(52) U.S. Cl.
CPC .. *H01J 37/32091* (2013.01); *H01J 37/32174* (2013.01); *C23C 14/50* (2013.01)

(56) References Cited

U.S. PATENT DOCUMENTS

| | | |
|---|---|---|
| 6,183,564 B1 | 2/2001 | Reynolds et al. |
| 8,213,007 B2 | 7/2012 | Wang et al. |
| 9,087,679 B2 | 7/2015 | Rasheed et al. |
| 9,274,105 B2 | 3/2016 | Guo et al. |
| 2008/0017501 A1* | 1/2008 | Inagawa ............. H01J 37/3441 204/192.1 |
| 2009/0314636 A1 | 12/2009 | Ishikawa et al. |
| 2012/0164834 A1 | 6/2012 | Jennings et al. |
| 2013/0166088 A1* | 6/2013 | Hatcher ................... G05F 5/00 700/295 |
| 2014/0097751 A1* | 4/2014 | Thomas ................... H05H 1/46 315/111.21 |
| 2014/0251789 A1* | 9/2014 | Miller ............... H01J 37/32669 204/192.12 |
| 2016/0189940 A1 | 6/2016 | Xie et al. |
| 2016/0244874 A1* | 8/2016 | Ge .......................... C23C 14/54 |
| 2020/0176234 A1 | 6/2020 | Abraham et al. |
| 2020/0211823 A1* | 7/2020 | Hisatomi .......... H01J 37/32146 |
| 2020/0234928 A1 | 7/2020 | Vishwanath |
| 2021/0241999 A1 | 8/2021 | Wu et al. |
| 2021/0319989 A1 | 10/2021 | Chong et al. |

* cited by examiner

METHODS AND APPARATUS FOR PROCESSING A SUBSTRATE

FIELD

Embodiments of the disclosure generally relate to methods and apparatuses for processing a substrate. For example, embodiments of the disclosure relate to methods and apparatus that use an auto-capacitive tuner (ACT) connected to an RF source that connects to a target.

BACKGROUND

Physical vapor deposition (PVD) chambers are known. For example, PVD chambers sputter material on a substrate supported on a substrate support disposed in a processing volume of the PVD chamber. After a PVD process is performed, some of the sputter material may be deposited on a process kit (e.g., residue on a shield), also disposed in the processing volume.

Conventional PVD chambers use an etch process to clean the residue (e.g., carbon/carbon nitride C/CN)) on the process kit to maintain good particle performance. For example, in some instances, the etch process can include using, for example, ions from oxygen (O2) plasma to bombard the process kit. However, an etch rate during a cleaning process can be limited by one or more factors, e.g., the process kit temperature, which can be relatively high. Accordingly, time is required for the process kit to cool down in order for the etch process to be effective. Thus, the time to perform a cleaning process to remove the residue on the process kit can be relatively high, which can result in low processing chamber productivity and throughput.

SUMMARY

Methods and apparatus for processing a substrate are provided herein. In some embodiments, a processing chamber for processing a substrate comprises a sputtering target disposed in an inner volume of the processing chamber, a chamber wall at least partially defining the inner volume within the processing chamber and connected to ground, a power source comprising an RF power source connected to the sputtering target and configured to energize cleaning gas for forming a plasma in the inner volume during an etch process, a process kit surrounding the sputtering target and a substrate support, an auto capacitor tuner (ACT) connected to ground and the sputtering target, and a controller configured to energize the cleaning gas disposed in the inner volume of the processing chamber to create the plasma, and tune the sputtering target using the ACT to maintain a predetermined potential difference between the plasma in the inner volume and the process kit during the etch process to remove sputtering material from the process kit, wherein the predetermined potential difference is based on a resonant point of the ACT.

In accordance with at least some embodiments, a method for cleaning a process kit disposed in an inner volume of a processing chamber comprises energizing a cleaning gas disposed in the inner volume of the processing chamber to create a plasma, and tuning an auto capacitor tuner (ACT) connected to ground, a sputtering target disposed in the inner volume, and a controller configured to tune the sputtering target using the ACT to maintain a predetermined potential difference between the plasma in the inner volume and a process kit during an etch process to remove sputtering material from the process kit, wherein the predetermined potential difference is based on a resonant point of the ACT.

In accordance with at least some embodiments, a non-transitory computer readable storage medium has stored thereon instructions that when executed by a processor perform a method for cleaning a process kit disposed in an inner volume of a processing chamber. The method comprises energizing a cleaning gas disposed in the inner volume of the processing chamber to create a plasma, and tuning an auto capacitor tuner (ACT) connected to ground, a sputtering target disposed in the inner volume, and a controller configured to tune the sputtering target using the ACT to maintain a predetermined potential difference between the plasma in the inner volume and a process kit during an etch process to remove sputtering material from the process kit, wherein the predetermined potential difference is based on a resonant point of the ACT.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
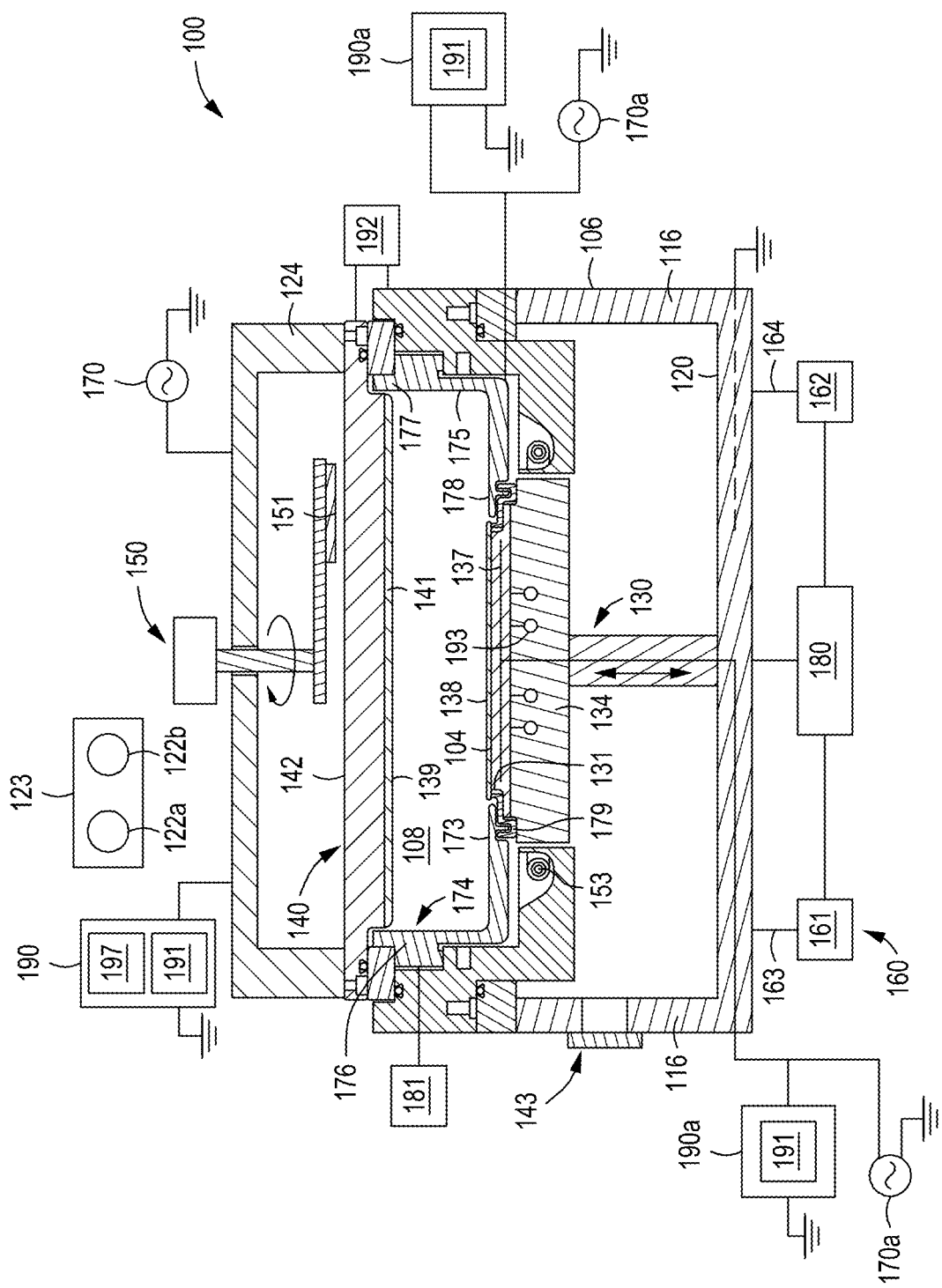
FIG. 1 depicts a schematic side view of a processing chamber, in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

In accordance with the present disclosure, methods and apparatus use an auto-capacitive tuner (ACT) connected to a sputtering target and to ground. For example, with the implementation of the ACT connected to the sputtering target, a plasma potential can be manipulated with different ACT positions. The ACT can be tuned to specific ACT positions of a total tuning capacitance. For example, the inventors have found that tuning the ACT to a resonant point, which can be determined from ACT tuning curves, an etch rate on the process kit can be greatly enhanced. With enhanced etch rate, a total in processing chamber clean time of residue deposition on a process kit can be improved, thus resulting in higher chamber productivity, improved throughput, and less defectivity.

FIG. 1 depicts a schematic side view of a processing chamber 100 (e.g., a PVD chamber) in accordance with some embodiments of the present disclosure. Examples of PVD chambers suitable for use with process kit shields of the present disclosure are commercially available from Applied Materials, Inc., of Santa Clara, California. Other processing chambers from Applied Materials, Inc. or other manufacturers may also benefit from the inventive apparatus disclosed herein.

The processing chamber 100 comprises chamber walls 106 that enclose an inner volume 108 (process volume/cavity). The chamber walls 106 include sidewalls 116 and a bottom wall 120. The processing chamber 100 can be a standalone chamber or a part of a multi-chamber platform (not shown) having a cluster of interconnected chambers connected by a substrate transfer mechanism that transfers substrates 104 between the various chambers. The processing chamber 100 may be a PVD chamber capable of sputter depositing material onto a substrate 104 and etching/cleaning a process kit of the processing chamber 100, as described in greater detail below. Non-limiting examples of suitable materials for sputter deposition include one or more of carbon (C), silicon (Si), silicon nitride (SiN), aluminum (Al), tungsten (W), tungsten carbide (WC), copper (Cu), titanium (Ti), titanium nitride (TiN), titanium carbide (TiC), carbon nitride (CN), or the like.

The processing chamber 100 comprises a substrate support 130 which comprises a pedestal 134 to support the substrate 104. The substrate support surface 138 of the pedestal 134 receives and supports the substrate 104 during processing. The pedestal 134 may include an electrostatic chuck or a heater (such as an electrical resistance heater, heat exchanger, or other suitable heating device). The substrate 104 can be introduced into the processing chamber 100 through a substrate loading inlet 143 in the sidewall 116 of the processing chamber 100 and placed onto the substrate support 130. The substrate support 130 can be lifted or lowered by a support lift mechanism, and a lift finger assembly can be used to lift and lower the substrate 104 onto the substrate support 130 during placement of the substrate 104 on the substrate support 130 by a robot arm. The pedestal 134 is biasable and can be maintained at an electrically floating potential or grounded during plasma operation. For example, in some embodiments, the pedestal 134 may be biased to a given potential such that during a cleaning process of a process kit, a power supply (e.g., an RF power source or a DC power source) can be used to ignite one or more gases (e.g., a cleaning gas) to create a plasma including ions and radicals that can used to react with one or more materials deposited on the process kit, as will be described in greater detail below.

The pedestal 134 has a substrate support surface 138 having a plane substantially parallel to a sputtering surface 139 of a sputtering target 140, which can be connected to an ACT, as described in greater detail below. The sputtering target 140 comprises a sputtering plate 141 mounted to a backing plate 142, which can be thermally conductive, using one or more suitable mounting devices, e.g., a solder bond. The sputtering plate 141 comprises a material to be sputtered onto the substrate 104. The backing plate 142 is made from a metal, such as, for example, stainless steel, aluminum, copper-chromium or copper-zinc. The backing plate 142 can be made from a material having a thermal conductivity that is sufficiently high to dissipate the heat generated in the sputtering target 140, which is formed in the sputtering plate 141 and the backing plate 142. The heat is generated from the eddy currents that arise in the sputtering plate 141 and the backing plate 142 and also from the bombardment of energetic ions from the plasma onto the sputtering surface 139 of the sputtering target 140. The backing plate 142 allows dissipation of the heat generated in the sputtering target 140 to the surrounding structures or to a heat exchanger which may be mounted behind the backing plate 142 or disposed within the backing plate 142. For example, the backing plate 142 can comprise channels (not shown) to circulate a heat transfer fluid therein. A suitably high thermal conductivity of the backing plate 142 is at least about 200 W/mK, for example, from about 220 to about 400 W/mK. Such a thermal conductivity level allows the sputtering target 140 to be operated for longer process time periods by dissipating the heat generated in the sputtering target 140 more efficiently, and also allows for relatively rapid cooling of the sputtering plate 141, e.g., when the area on and around a process kit needs to be cleaned.

In some embodiments, the processing chamber 100 may include a magnetic field generator 150 to shape a magnetic field about the sputtering target 140 to improve sputtering of the sputtering target 140. The capacitively generated plasma may be enhanced by the magnetic field generator 150 in which, for example, a plurality of magnets 151 (e.g., permanent magnet or electromagnetic coils) may provide a magnetic field in the processing chamber 100 that has a rotating magnetic field having a rotational axis that is perpendicular to the plane of the substrate 104. The processing chamber 100 may, in addition or alternatively, comprise a magnetic field generator 150 that generates a magnetic field near the sputtering target 140 of the processing chamber 100 to increase an ion density in a high-density plasma region adjacent to the sputtering target 140 to improve the sputtering of the target material.

A sputtering gas is introduced into the processing chamber 100 through a gas delivery system 160, which provides gas from a gas supply 161 via conduits 163 having gas flow control valves (not shown), such as a mass flow controllers, to pass a set flow rate of the gas therethrough. The sputtering gas may comprise a non-reactive gas, such as argon or xenon, which is capable of energetically impinging upon and sputtering material from the sputtering target 140. The process gas may also comprise a reactive gas, such as one or more of an oxygen-containing gas ($O_2$) and a nitrogen-containing gas ($N_2$), that can react with the sputtered material to form a layer on the substrate 104. The gas is then energized by a power supply (e.g., an RF power source or a DC power source) to form or create a plasma to sputter the sputtering target 140. For example, the process gases become ionized by high energy electrons and the ionized gases are attracted to the sputtering material, which is biased at a negative voltage (e.g., −300 to −1500 volts). The energy imparted to an ionized gas (e.g., now positively charged gas atoms) by the electric potential of the cathode causes sputtering. In some embodiments, the reactive gases can directly react with the sputtering target 140 to create compounds and then be subsequently sputtered from the sputtering target 140. For example, the cathode can be energized by both a DC power source 190 and an RF power source (e.g., an RF power source 170, if used). In some embodiments, the DC power source 190 can be configured to provide pulsed DC to power the cathode during deposition. Spent process gas and byproducts are exhausted from the processing chamber 100 through an exhaust 162. The exhaust 162 comprises an exhaust port (not shown) that receives spent process gas and passes the spent gas to an exhaust conduit 164 having a throttle valve to control the pressure of the gas in the processing chamber 100. The exhaust conduit 164 is connected to one or more exhaust pumps (not shown).

In addition, the gas delivery system 160 is configured to introduce one or more of the gases (e.g., depending on the material used for the sputtering target 140), which can be energized to create an active cleaning gas (e.g., ionized plasma or radicals), into the inner volume 108 of the processing chamber 100 for performing a cleaning process of a shield of a process kit, which will be described in greater detail below. Alternatively or additionally, the gas delivery system 160 can be coupled to a remote plasma source (not shown) that is configured to provide radicals (or plasma depending on the configuration of the remote plasma source) into the inner volume 108 of the processing chamber 100. The sputtering target 140 can be connected to the DC power source 190 and/or the RF power source 170. The DC power source 190 can apply a bias voltage to the sputtering target 140 relative to a shield of the process kit, which may be electrically floating during a sputtering process and/or the cleaning process. The DC power source 190, or a DC power source 190a, can also be used to apply a bias voltage to a cover ring section or a heater of an adapter section of a process kit, e.g., when performing a cleaning process of a shield.

While the DC power source 190 supplies power to the sputtering target 140 and other chamber components connected to the DC power source 190, in at least some embodiments, the RF power source 170 can be configured to energize the sputtering gas to form a plasma of the sputtering gas. The plasma formed impinges upon and bombards the sputtering surface 139 of the sputtering target 140 to sputter material off the sputtering surface 139 onto the substrate 104. In some embodiments, RF energy supplied by the RF power source 170 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (e.g., two or more) to provide RF energy in a plurality of the above frequencies. An additional RF power source can also be used to supply a bias voltage to the pedestal 134 and/or a cover ring section e.g., when performing a cleaning process of the area on and around a process kit. For example, in some embodiments an RF power source 170a can be used to energize a biasable electrode 137 that can be embedded in the pedestal 134 (or the substrate support surface 138 of the substrate support 130). The biasable electrode can be used to supply power to a shield and/or the substrate support 130. Moreover, in some embodiments, the RF power source 170 can be configured to energize the biasable electrode 137. For example, one or more additional components e.g., a switching circuit can be provided to switch the electrical path from the cover or lid 124 to the biasable electrode 137.

An RF filter 191 can be connected between the DC power source 190 (or the DC power sources 190a) and the RF power source 170 (or the RF power source 170a). For example, in at least some embodiments, the RF filter can be a component of the circuitry of the DC power source 190 to block RF signals from entering the DC circuitry of the DC power source 190 when the RF power source 170 is running, e.g., when performing a cleaning process.

Additionally, a relay box 197 (or other suitable device) can be connected to the DC power source 190 (or the DC power sources 190a) and controlled by a controller to disconnect the DC power source 190 from the target to protect the DC power source 190 during a cleaning process. For illustrative purposes, the relay box 197 is shown connected to the DC power source 190.

Various components of the processing chamber 100 may be controlled by a controller 180 (processor or system controller) during processing. The controller 180 comprises a central processing unit 194, a memory 195 (e.g., non-transitory computer readable storage medium), and support circuits 196 for the central processing unit 194 and facilitates control of the components of the processing chamber 100. The controller 180 may be one of any form of general-purpose computer processor that can be used in an industrial setting for controlling various chambers and sub-processors. The memory 195 stores software (source or object code) that may be executed or invoked to control the operation of the processing chamber 100 in the manner described herein.

The controller 180 comprises program code (e.g., stored in a non-transitory computer readable storage medium (memory)) having instructions to operate the components to process the substrate 104. For example, the controller 180 can comprise program code that includes substrate positioning instruction sets to operate the substrate support 130 and substrate transfer mechanism; temperature control of one or more heating components (e.g., a lamp, radiative heating, and/or embedded resistive heaters) of a heater; cleaning process instruction sets to an area on and around a process kit; gas flow control instruction sets to operate gas flow control valves to set a flow of sputtering gas to the processing chamber 100; gas pressure control instruction sets to operate the exhaust throttle valve to maintain a pressure (e.g., about 120 sccm) in the processing chamber 100; gas energizer control instruction sets to operate the RF power source 170 to set a gas energizing power level; temperature control instruction sets to control a temperature control system in the substrate support 130 or a heat transfer medium supply to control a flowrate of the heat transfer medium to the annular heat transfer channel; and process monitoring instruction sets to monitor the process in the processing chamber 100, e.g., monitoring/adjusting an auto capacitor tuner (ACT) 192. For example, in at least some embodiments, the ACT 192 can be connected to the sputtering target 140 (e.g., via the cover or lid 124) and to ground and used to tune the sputtering target 140 during a cleaning process of a process kit 174, as described in greater detail below.

The process kit 174 comprises various components including an adapter section 176 supported on walls of the processing chamber and having a resting surface to support a shield 175, which can be easily removed from the processing chamber 100, for example, to replace or repair eroded components, or to adapt the processing chamber 100 for other processes. Additionally, unlike conventional process kits, which need to be removed to clean sputtering deposits off the component surfaces (e.g., the shield 175), the inventors have designed the process kit 174 for in situ cleaning to remove sputtered deposits of material on the of the shield 201, as will be described in more detail below.

The shield 175 includes a cylindrical body having a diameter sized to encircle the sputtering surface 139 of the sputtering target 140 and the substrate support 130 (e.g., a diameter larger than the sputtering surface 139 and larger than the support surface of the substrate support 130). The cylindrical body has an upper portion 177 configured to surround the outer edge of the sputtering surface 139 of the sputtering target 140 when installed in the processing chamber 100. The shield 175 further includes a lower portion 178 configured to surround the substrate support surface 138 of the substrate support 130 when installed in the processing chamber 100. The lower portion 178 includes a cover ring section 173 for placement about a peripheral wall 131 of the substrate support 130. The cover ring section 173 encircles and at least partially covers a deposition ring 179 disposed about the substrate support 130 to receive, and thus, shadow the deposition ring 179 from the bulk of the sputtering deposits. In at least some embodiments, in addition to the RF power source 170 biasing the sputtering plate 141 to perform an etch process when the area on and around the process kit 174 needs to be cleaned, the cover ring section 173 of the lower portion 178 can also be biased using the DC power source 190a and/or the RF power source 170a to facilitate cleaning the cover ring section 173.

A lower portion of the process kit 174 is configured to house a heater, e.g., one or more suitable heating components including, but not limited to, a lamp, radiative heating, or embedded resistive heaters of the heater. In the illustrated embodiment, a radiative annular coil 153, which is surrounded by a lamp envelope, e.g., glass, quartz or other suitable material (not shown). The radiative annular coil 153 can be energized or powered using, for example, the DC power source 190 or the DC power source 190a, which can be controlled by the controller 180, to reach temperatures of about 250° C. to about 300° C. when the area on and around the process kit 174 needs to be cleaned.

Figure 2:
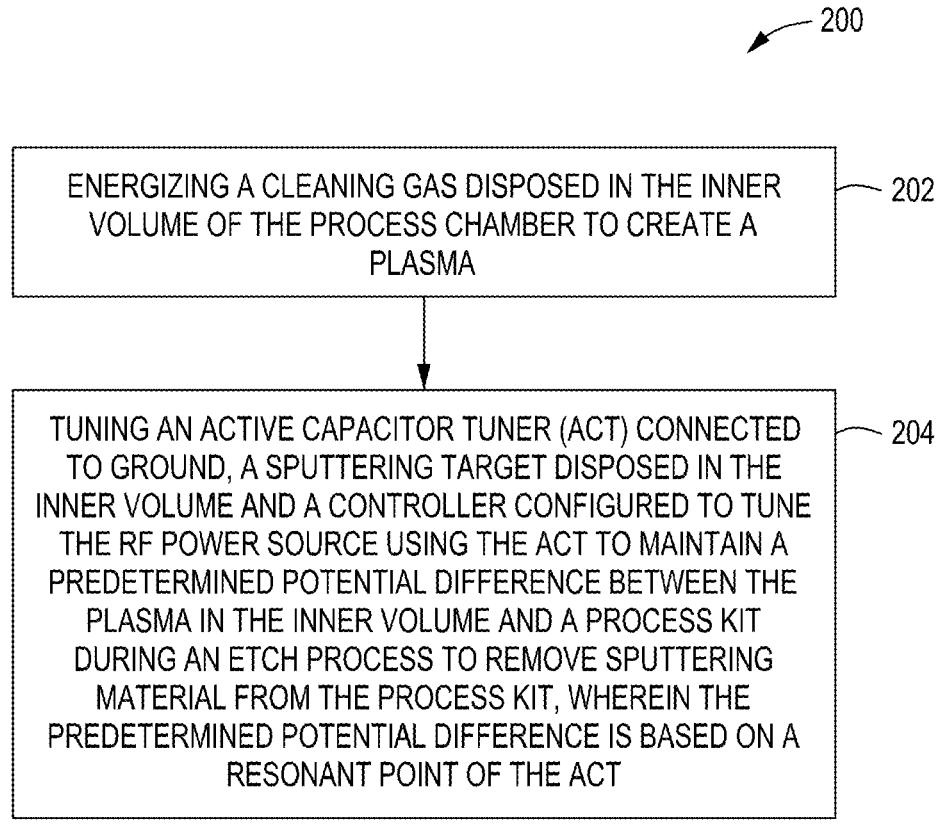
FIG. 2 is a flowchart of a method for cleaning a process kit configured for processing a substrate, in accordance with some embodiments of the present disclosure.

FIG. 2 is a flowchart of a method 200 for cleaning a process kit (e.g., the process kit 174) configured for processing a substrate in accordance with some embodiments of the present disclosure. As noted above, the sputtering plate 141 can be made from one or more suitable materials to be deposited on a substrate. For example, the sputtering plate 141 can be made of carbon (C), silicon (Si), silicon nitride (SiN), aluminum (Al), tungsten (W), tungsten carbide (WC), copper (Cu), titanium (Ti), titanium nitride (TiN), titanium carbide (TiC), carbon nitride (CN), or the like. The specific material that the sputtering plate 141 can be made from can depend on the material desired to be deposited on a substrate in the processing chamber. The specific material that the sputtering plate 141 (or target material) is made from can influence one more factors relating to the chamber configuration and cleaning processes, e.g., the type of activated cleaning gases used for cleaning the process kit, whether a shutter (or shutter assembly) is used to protect the sputtering plate 141 while the process kit is being cleaned, etc.

In some embodiments, one or more activated cleaning gases can be used to clean on and around the process kit 174. The activated cleaning gas, for example, can be a cleaning gas introduced into the processing chamber 100 and subsequently energized to form a plasma to create radicals (e.g., the activated cleaning gas) that can be directed toward the process kit 174. Alternatively or in combination, radicals (e.g., the activated cleaning gas) can be introduced into the processing chamber from a remote plasma source and then directed toward the process kit 174. The cleaning gases that are activated using the plasma to form radicals of the cleaning gases can be, for example, oxygen ($O_2$), or other oxygen-containing gases, e.g., ozone ($O_3$), hydroxide (OH), peroxide ($H_2O_2$), or the like, chlorine ($Cl_2$), or other chlorine containing gases, or the like, boron (B), fluorine (F), nitrogen (N), niobium (Nb), sulfur (S), or combinations thereof. The type of cleaning gas used can depend on, for example, the type of target material, the type of chamber (e.g., PVD etc.), a manufacturer's preference, etc. For example, if the target material is Al, the plasma can be created using $Cl_2$ or $BCl_3$, and the shield 175 can be made from a material other than Al, if the target material is Ti, the plasma can be created using $SF_6$ or $Cl_2$, if the target material is W, the plasma can be created using $Cl_2$ or other chlorine or fluorine based gases, if the target material is Cu, the plasma can be created using $NbCl_3$, and if the target material is Si, the plasma can be created using $NF_3$.

In accordance with the present disclosure, cleaning on and around the process kit 174 can be performed in accordance with routine maintenance of the processing chamber 100. For example, the method 200 can be performed periodically to reduce deposition buildup on and around the process kit 174. For example, when carbon is used as the sputtering plate 141, the method 200 can be used to remove carbon build-up on the shield (e.g., a shield edge, a shield top, and/or a shield corner). The cleaning process can be run periodically whenever sufficient materials have built up on the process kit 174. For example, the cleaning process can be performed after about 5 μm of carbon has been deposited, which can be equal to about 50 or so substrates (or wafers) of a deposition for a 1000 Å film deposited on each substrate.

Prior to cleaning on and around the process kit 174, a dummy wafer 122a can be loaded into the inner volume 108 of the processing chamber 100 and disposed on the substrate support 130 to protect the components of the substrate support 130, e.g., the pedestal 134, the substrate support surface 138, etc. Alternatively or additionally a shutter disk 122b can placed on or over the substrate support 130 to protect the components of the substrate support 130. Conversely, neither of the dummy wafer 122a nor shutter disk 122b need be used.

Additionally, in some embodiments, the shutter disk 122b can be positioned in front of the sputtering target 140 and used to prevent the reactive gas from reaching the sputtering target 140 while the accumulated deposition on the process kit 174 is removed.

The dummy wafer 122a and/or shutter disk 122b can be stored in, for example, a peripheral holding area 123 and can be moved into the processing chamber 100 prior to cleaning on and around the process kit 174.

The inventors have found that to facilitate removal of accumulated deposited material on the process kit 174, the area on and around the process kit 174 can be actively heated (e.g., heated to temperatures above that which are used to process a substrate). For example, when the sputtering target 140 is carbon, to facilitate a carbon and oxygen radical reaction (e.g., to form carbon dioxide), to selectively (e.g., to concentrate cleaning to a specific area within the inner volume 108 of the processing chamber 100) clean on and around the process kit 174, and to maximize cleaning on and around the process kit 174, a temperature differential between the sputtering plate 141 and the area on and around the process kit 174 needs to be maintained. Accordingly, to actively achieve such a temperature differential, the sputtering plate 141 can be kept at a relatively low temperature, e.g., a temperature of about 25° C. and to about 100° C. Backside cooling of the sputtering plate 141 using, for example, the heat transfer fluid as described above, can be used to achieve such temperatures. Actively cooling the sputtering plate 141, can be useful when the area on and around the process kit 174 is cleaned shortly after PVD has been performed, e.g., when a temperature of sputtering plate 141 is relatively high. Alternatively or additionally, the sputtering plate 141 can be allowed to passively cool over time without using any cooling devices. Accordingly, in some embodiments, the sputtering plate 141 can be maintained at a temperature of about 25° C. and to about 100° C. during the cleaning process. Alternatively or additionally, during the cleaning process, the sputtering plate 141 can be actively cooled so that no etch reaction happens to the sputtering target 140, thus protecting an integrity of the sputtering target 140 (e.g., sustain the target materials).

Next, to ensure that the above-described temperature differential is achieved/maintained, the area on and around the process kit 174 can be actively heated to a temperature of about 250° C. to about 300° C., e.g., heating the shield. As noted above, the radiative annular coil 153 of the heater can be energized using the DC power source 190 (or the or the DC power source 190*a*) to achieve such temperatures, and the amount of energy provided from the DC power source 190 to the radiative annular coil 205 can be controlled by the controller 180.

Thereafter, one or more processes can be used to create a plasma to form corresponding ions and radicals, which can used to react with the accumulated deposited material on and around the process kit 174. For example, at 202 a cleaning gas disposed in the inner volume of the processing chamber can be energized to create a plasma. For example, in some embodiments, when the accumulated deposited material around the processing kit 174 is carbon, oxygen can be introduced into the inner volume 108 of the processing chamber 100 using, for example, the gas delivery system 160. Once introduced, the oxygen plasma including ions and radicals can be created by energizing the oxygen gas using, for example, the RF power source 170 and the pedestal 134 (or the cover ring section 173), each of which as noted above can be biased to a voltage potential using a respective one of the RF power source 170 and one or both the RF power source 170*a* or the DC power source 190*a*.

Next, at 204 an auto capacitor tuner (e.g., the ACT 192) connected to the sputtering target (e.g., the sputtering target 140) can be tuned such that a potential difference between the plasma in the inner volume 108 and the process kit 174 is maintained at a predetermined value (e.g., a predetermined potential difference), such as at a maximum to facilitate removing material deposited on and around the process kit 174. For example, the ACT 192 is used to maintain a voltage potential difference between the plasma in the inner volume 108 and the shield 175 at a maximum. More particularly, after the RF power source 170 ignites the oxygen gas, the sputtering target 140 is used to maintain the plasma (e.g., target sheath) within the processing chamber 100 (e.g., from about 100 W to about 2500 W) and the controller 180 controls the ACT 192 to ensure that the voltage potential between plasma and the voltage potential of the shield 175, which is typically grounded through the processing chamber 100 during the cleaning process, reaches a maximum. For example, the predetermined potential difference is based on a resonant point of the ACT 192. In at least some embodiments, the resonant point of the ACT 192 can be determined using ACT processing curves. For example, using empirical data, the inventors have found that the ACT processing curves supported a resonant point of the ACT 192 to be about 58% to about 75% of total tuning capacitance. For example, with the ACT 192 at about 60% of total tuning capacitance the etch rate of the shield edge was about 11.7 A/s (compared to an etch rate of about 7 A/s without using the ACT 192), the etch rate of the shield top was about 11.5 A/s (compared to an etch rate of about 2.5 A/s without using the ACT 192), and the etch rate of the shield corner was about 12 A/s (compared to an etch rate of about 2.7 A/s without using the ACT 192).

In at least some embodiments, at 204, the method 200 comprises disconnecting a DC power source during the etch process using a relay box. For example, in at least some embodiments, during 204, the DC power source 190 can be disconnected from the sputtering target 140 using the relay box 197.

The oxygen can be introduced into the inner volume 108 of the processing chamber 100 using, for example, the gas delivery system 160, and the microwave power source 181 can be used to create the oxygen plasma to form the oxygen ions and radicals.

Once oxygen gas is energized for forming the oxygen plasma, the oxygen radicals react with the carbon deposited on and around the process kit 174 and convert the deposited carbon to carbon dioxide (e.g., to selectively etch or remove the carbon), which thereafter can then be pumped from the inner volume 108 of the processing chamber 100 via, for example, the exhaust 162. Alternatively or additionally, some of the oxygen ions from the oxygen plasma (e.g., in addition to the oxygen radicals) can also be used to react with the carbon deposited on and around the process kit 174 for converting the deposited carbon to carbon dioxide, which can depend on the ratio of oxygen radicals to oxygen ions in the oxygen plasma. For example, a ratio of oxygen ions to oxygen radicals can be controlled so that more (or less) ionized oxygen is created in the plasma and less (or more) oxygen radicals are created.

The controller 180 can control the exhaust 162 to begin exhausting the carbon dioxide at, for example, an endpoint of carbon dioxide production, which can be detected using one or more sensors (not shown) disposed in the inner volume 108 of the processing chamber 100. For example, in some embodiments, the controller 180 can use the one or more sensors to determine an end point of a cleaning time based on a composition of exhaust gas. The controller 180 can also use the one or more sensors to determine a voltage of the sputtering target 140, pedestal 134, and/or a plasma within the inner volume 108 of the processing chamber 100, e.g., to maintain a maximum potential difference between the plasma in the inner volume and the process kit 174.

Alternatively or additionally, the controller 180 can be configured to control the exhaust 162 to begin exhausting the carbon dioxide at, for example, a predetermined time, which can be calculated via empirical data.

In at least some embodiments, after the cleaning process is completed, the controller 180 can run one or more additional processes, e.g., seasoning is required to remove some of the debris (flake) deposited on the sputtering target 140 during the cleaning process. For example, seasonings/applications of pulsed DC plasma can be run (e.g., 10-20 runs), with the dummy wafer 122*a* and/or shutter disk disposed on the substrate support 130, until a condition of the sputtering target 140 has been sufficiently recovered.

While the foregoing is directed to embodiments of the present disclosure, other and further embodiments of the disclosure may be devised without departing from the basic scope thereof.

The invention claimed is:

1. A processing chamber for processing a substrate, comprising:
   a chamber wall at least partially defining an inner volume within the processing chamber and configured to be connected to ground;
   a power source comprising an RF power source configured to be connected to a sputtering target, when installed in a lid of the processing chamber;
   a process kit surrounding a substrate support disposed in the inner volume;
   an auto capacitor tuner (ACT) configured to be connected to ground and the sputtering target, when the sputtering target is installed; and
   a controller configured to:
      control the RF power source to energize a cleaning gas disposed in the inner volume of the processing chamber to create a plasma during an etch process; and
      control the ACT to maintain a predetermined potential difference between the plasma in the inner volume and the process kit during the etch process to remove sputtering material from the process kit, wherein the predetermined potential difference is based on a resonant point of the ACT, wherein the process kit comprises a shield and wherein the resonant point is about 58% to about 75% of total tuning capacitance such that the controller is configured to control the etch process so that an edge of the shield at a rate of about 11.7 Å/s, a top of the shield at a rate of about 11.5 Å/s, and a corner of the shield at a rate of about 12 Å/s.

2. The processing chamber of claim 1, wherein the resonant point is about 60% of the total tuning capacitance.

3. The processing chamber of claim 1, wherein the power source further comprises a DC power source configured to provide pulsed DC to the sputtering target, when the sputtering target is installed, for physical vapor deposition.

4. The processing chamber of claim 3, further comprising a relay box connected to the DC power source and configured to disconnect the DC power source from the processing chamber during the etch process.

5. The processing chamber of claim 3, wherein the process kit comprises:
the shield having a cylindrical body having an upper portion and a lower portion;
an adapter section supported on walls of the processing chamber and having a resting surface to support the shield; and
a heater coupled to the adapter section to heat the shield during use.

6. The processing chamber of claim 1, wherein the cleaning gas is at least one of boron (B), fluorine (F), nitrogen (N), niobium (Nb), oxygen ($O_2$), ozone ($O_3$), hydroxide (OH), peroxide ($H_2O_2$), chlorine ($Cl_2$), or sulfur (S).

7. A method for cleaning a process kit disposed in an inner volume of a processing chamber, comprising:
energizing a cleaning gas disposed in the inner volume of the processing chamber to create a plasma; and
controlling an auto capacitor tuner (ACT), connected to ground and to a sputtering target disposed in the inner volume, using a controller configured to tune the ACT to maintain a predetermined potential difference between the plasma in the inner volume and a process kit during an etch process to remove sputtering material from the process kit, wherein the predetermined potential difference is based on a resonant point of the ACT, wherein the process kit comprises a shield and wherein the resonant point is about 58% to about 75% of total tuning capacitance such that the controller is configured to control the etch process so that an edge of the shield at a rate of about 11.7 Å/s, a top of the shield at a rate of about 11.5 Å/s, and a corner of the shield at a rate of about 12 Å/s.

8. The method of claim 7, wherein the resonant point is at about 60% of the total tuning capacitance.

9. The method of claim 7, further comprising disconnecting a DC power source during the etch process using a relay box, wherein the DC power source is configured to provide pulsed DC to the sputtering target for physical vapor deposition.

10. The method of claim 7, wherein the process kit comprises:
the shield having a cylindrical body having an upper portion and a lower portion;
an adapter section supported on walls of the processing chamber and having a resting surface to support the shield; and
a heater coupled to the adapter section to heat the shield.

11. The method of claim 10, further comprising:
maintaining the sputtering target at a first temperature; and
heating the shield of the process kit to a second temperature that is greater than the first temperature.

12. The method of claim 11, wherein the first temperature is about 50° C. to about 100° C., and wherein the second temperature is about 250° C. to about 300° C.

13. The method of claim 7, wherein the cleaning gas is at least one of boron (B), fluorine (F), nitrogen (N), niobium (Nb), oxygen ($O_2$), ozone ($O_3$), hydroxide (OH), peroxide ($H_2O_2$), chlorine ($Cl_2$), or sulfur (S).

14. A non-transitory computer readable storage medium having stored thereon instructions that when executed by a processor perform a method for cleaning a process kit disposed in an inner volume of a processing chamber, comprising:
energizing a cleaning gas disposed in the inner volume of the processing chamber to create a plasma; and
controlling an auto capacitor tuner (ACT), connected to ground and to a sputtering target disposed in the inner volume, using a controller configured to tune the ACT to maintain a predetermined potential difference between the plasma in the inner volume and a process kit during an etch process to remove sputtering material from the process kit, wherein the predetermined potential difference is based on a resonant point of the ACT, wherein the process kit comprises a shield and wherein the resonant point is about 58% to about 75% of total tuning capacitance such that the controller is configured to control the etch process so that an edge of the shield at a rate of about 11.7 Å/s, a top of the shield at a rate of about 11.5 Å/s, and a corner of the shield at a rate of about 12 Å/s.

15. The non-transitory computer readable storage medium of claim 14, wherein the resonant point is at about 60% of the total tuning capacitance.

16. The non-transitory computer readable storage medium of claim 14, further comprising disconnecting a DC power source during the etch process using a relay box, wherein the DC power source is configured to provide pulsed DC to the sputtering target for physical vapor deposition.

17. The non-transitory computer readable storage medium of claim 14, wherein the process kit comprises:
the shield having a cylindrical body having an upper portion and a lower portion;
an adapter section supported on walls of the processing chamber and having a resting surface to support the shield; and
a heater coupled to the adapter section to heat the shield.

* * * * *